(12) United States Patent
Nishitani

(10) Patent No.: US 11,842,879 B2
(45) Date of Patent: Dec. 12, 2023

(54) ELECTRON GUN, ELECTRON GUN COMPONENT, ELECTRON BEAM APPLICATOR, AND ALIGNMENT METHOD

(71) Applicant: PHOTO ELECTRON SOUL INC., Aichi (JP)

(72) Inventor: Tomohiro Nishitani, Aichi (JP)

(73) Assignee: Photo electron Soul Inc., Nagoya (JP)

( * ) Notice: Subject to any disclaimer, the term of this patent is extended or adjusted under 35 U.S.C. 154(b) by 0 days.

(21) Appl. No.: 17/996,213

(22) PCT Filed: Aug. 20, 2021

(86) PCT No.: PCT/JP2021/030504
§ 371 (c)(1),
(2) Date: Oct. 13, 2022

(87) PCT Pub. No.: WO2022/054535
PCT Pub. Date: Mar. 17, 2022

(65) Prior Publication Data
US 2023/0207249 A1 Jun. 29, 2023

(30) Foreign Application Priority Data
Sep. 9, 2020 (JP) ................. 2020-151320

(51) Int. Cl.
*H01J 37/073* (2006.01)
(52) U.S. Cl.
CPC ....... *H01J 37/073* (2013.01); *H01J 2237/024* (2013.01); *H01J 2237/06333* (2013.01); *H01J 2237/06375* (2013.01)
(58) Field of Classification Search
CPC ............... H01J 37/073; H01J 2237/024; H01J 2237/06333; H01J 2237/06375
See application file for complete search history.

(56) References Cited

U.S. PATENT DOCUMENTS

2003/0071558 A1* 4/2003 Oh .................. H01J 29/48
313/482
2007/0228286 A1 10/2007 Lewellen et al.
(Continued)

FOREIGN PATENT DOCUMENTS

EP           3780063 A1      2/2021
JP         H9-298032 A     11/1997
(Continued)

OTHER PUBLICATIONS

International Search Report, dated Oct. 12, 2021 for corresponding International Application No. PCT/JP2021/030504 with English translation (5 pages).
(Continued)

*Primary Examiner* — Mary Ellen Bowman
(74) *Attorney, Agent, or Firm* — Intellectual Property Law Group LLP

(57) ABSTRACT

Provided are an electron gun, an electron gun component, an electron beam applicator, and an alignment method that can align the emission axis of an electron beam with the optical axis of the electron optical system of the counterpart device even when misalignment of a mounted position of the electron gun being mounted to the counterpart device is larger. The electron gun includes: a light source; a vacuum chamber; a photocathode that emits an electron beam in response to receiving light from the light source; an electrode kit; and an electrode kit drive device, the electrode kit includes a photocathode supporting part, and an anode arranged spaced apart from the photocathode supporting part, the photocathode is placed on the photocathode supporting part, and the electrode kit drive device moves the electrode kit in an X-Y plane, where one direction is defined as an X direction, a direction orthogonal to the X direction
(Continued)

is defined as a Y direction, and a plane including the X direction and the Y direction is defined as the X-Y plane.

20 Claims, 11 Drawing Sheets

(56) References Cited

U.S. PATENT DOCUMENTS

| | | | |
|---|---|---|---|
| 2016/0172144 A1 | 6/2016 | Nishitani | |
| 2021/0035766 A1* | 2/2021 | Nishitani | H01J 37/15 |
| 2021/0134551 A1 | 5/2021 | Iijima | |
| 2021/0375578 A1 | 12/2021 | Watanabe et al. | |
| 2022/0181111 A1 | 6/2022 | Shikano et al. | |
| 2022/0359146 A1* | 11/2022 | Iijima | H01J 37/073 |

FOREIGN PATENT DOCUMENTS

| | | |
|---|---|---|
| JP | 2002-313273 A | 10/2002 |
| JP | 2002-313273 A | 10/2002 |
| JP | 3537779 B2 | 3/2004 |
| JP | 2018181403 A | 11/2018 |
| JP | 6466020 B1 | 2/2019 |
| JP | 6578529 B1 | 9/2019 |
| JP | 6679014 B1 | 4/2020 |
| WO | WO2015/008561 A1 | 1/2015 |
| WO | WO2018/186294 A1 | 10/2018 |
| WO | WO2019/221119 A1 | 11/2019 |

OTHER PUBLICATIONS

Written Opinion of the ISA, dated Oct. 12, 2021 for corresponding International Application No. PCT/JP2021/030504 with English translation (4 pages).

Japan Office Action, dated Oct. 20, 2020 for corresponding Japanese Patent Application No. 2020-151320 with English translation (4 pages).

International Search Report, dated Apr. 27, 2021 for corresponding International Application No. PCT/JP2021/013455 with English translation (4 pages).

Written Opinion of the ISA, dated Apr. 27, 2021 for corresponding International Application No. PCT/JP2021/013455 (7 pages).

Japan Office Action, dated May 25, 2020 for corresponding Japanese Patent Application No. 2020-073311 with English translation (12 pages).

Daiki Sato et al., "Observation of relaxation time of surface charge limit for InGaN photocathodes with negative electron affinity" Japanese Journal of Applied Physics, dated 2016 Jpn. J. Appl. Phys. 5505FH05 (5 pages).

Extended European Search Report, dated Sep. 14, 2023 for corresponding European Application No. EP 21 86 6495 (total 9 pages).

Park, In-Yong et al., "Low-carbon steel ultra-high-vacuum Schottky emitter electron gun with double O-rings for axis adjustment", J. Vac. Sci. Technol, vol. 35, No. 2, Dec. 6, 2016, pp. 1-6 (total 6 pages).

* cited by examiner

ELECTRON GUN, ELECTRON GUN COMPONENT, ELECTRON BEAM APPLICATOR, AND ALIGNMENT METHOD

CROSS-REFERENCE TO RELATED APPLICATIONS

This application is a U.S. National Phase application, under 35 U.S.C. § 371, of International Application no. PCT/JP2021/030504, with an international filing date of Aug. 20, 2021, and claims priority to Japanese application no. 2021-151320 filed on Sep. 9, 2020, each of which is hereby incorporated by reference for all purposes.

TECHNICAL FIELD

The disclosure in the present application relates to an electron gun, an electron gun component, an electron beam applicator, and an alignment method.

BACKGROUND ART

Electron guns equipped with a photocathode and electron beam applicators such as an electron microscope, a free electron laser accelerator, an inspection device, or the like including such an electron gun (hereafter, a device from which an electron gun is removed from electron beam applicators therefrom may be referred to as a "counterpart device") are known. For example, Patent Literature 1 discloses an electron microscope device with a photocathode that emits an electron beam in response to being irradiated with excitation light from a light source.

A device having an electron gun needs to obtain a bright image and high resolution. Thus, such a device requires work for adjusting the emission axis of an electron beam so that the emission axis of the electron beam emitted from the electron gun aligns with the optical axis of an electron optical system of the device when the electron gun is initially mounted or when the electron gun is replaced. Further, also during normal operation, adjustment of the emission axis of the electron beam is performed as needed in order to correct misalignment between the emission axis of the electron beam and the optical axis of the electron optical system of the device caused by a temporal change or the like.

Patent Literature 2 discloses axis alignment of the emission axis of an electron beam, which is emitted from an electron gun equipped with a photocathode, with the optical axis of the electron optical system of a counterpart device.

CITATION LIST

Patent Literature

Patent Literature 1: Japanese Patent Application Laid-Open No. 2002-313273
Patent Literature 2: International Publication No. 2019/221119

SUMMARY OF INVENTION

Technical Problem

Axis alignment as disclosed in Patent Literature 2 essentially requires the electron gun to be mounted precisely at a position of the counterpart device where at least the emission axis of an electron beam can be adjusted. However, precise mounting of the electron gun to the counterpart device requires skilled techniques, which is not easy for everyone to carry out. Accordingly, there is a demand for a novel axis alignment method (device) that can align the emission axis of an electron beam with the optical axis of the electron optical system of the counterpart device even when misalignment of an installed position in installation of an electron gun to a counterpart device is larger than in the conventional case.

The disclosure of the present application is to provide an electron gun, an electron gun component, an electron beam applicator, and an alignment method that can align the emission axis of an electron beam with the optical axis of the electron optical system of a counterpart device even when misalignment of an installed position in installation of the electron gun to the counterpart device is larger. Other optional, additional advantageous effects of the disclosure in the present application will be apparent in embodiments of the invention.

Solution to Problem (1) An electron gun comprising:
 a light source;
 a vacuum chamber;
 a photocathode that emits an electron beam in response to receiving light from the light source;
 an electrode kit; and
 an electrode kit drive device,
 wherein the electrode kit includes
 a photocathode supporting part, and
 an anode arranged spaced apart from the photocathode supporting part,
 wherein the photocathode is placed on the photocathode supporting part, and
 wherein the electrode kit drive device moves the electrode kit in an X-Y plane, where one direction is defined as an X direction, a direction orthogonal to the X direction is defined as a Y direction, and a plane including the X direction and the Y direction is defined as the X-Y plane.
(2) The electron gun according to (1) above, wherein the photocathode, the electrode kit, and a part of the electrode kit drive device are arranged inside the vacuum chamber.
(3) The electron gun according to (1) or (2) above, wherein the electrode kit drive device includes a stage, and the anode is placed on the stage.
(4) The electron gun according to (3) above, wherein the stage includes
 a first stage configured to move in the X direction, and
 a second stage configured to move in the Y direction.
(5) The electron gun according to any one of (1) to (4) above, wherein the electrode kit includes an intermediate electrode arranged between the photocathode supporting part and the anode.
(6) The electron gun according to any one of (1) to (5) above further comprising a photocathode drive device that moves the photocathode in a Z direction orthogonal to the X direction and the Y direction,
 wherein the photocathode drive device includes a pressing member that presses the photocathode against the photocathode supporting part when the photocathode is placed on the photocathode supporting part, and
 wherein the photocathode pressed by the pressing member moves to follow the photocathode supporting part in accordance with motion of the electrode kit.

(7) The electron gun according to any one of (1) to (6) above further comprising a photocathode holder,
wherein the photocathode holder holds the photocathode and includes a lens that is arranged spaced apart from the photocathode and collects light from the light source on the photocathode.

(8) An electron gun component comprising:
an electrode kit; and
an electrode kit drive device,
wherein the electrode kit includes
a photocathode supporting part, and
an anode arranged spaced apart from the photocathode supporting part,
wherein the electrode kit drive device moves the electrode kit in an X-Y plane, where one direction is defined as an X direction, a direction orthogonal to the X direction is defined as a Y direction, and a plane including the X direction and the Y direction is defined as the X-Y plane.

(9) The electron gun component according to (8) above, wherein the electrode kit drive device includes a stage, and
wherein the anode is placed on the stage.

(10) The electron gun component according to (9) above, wherein the stage includes
a first stage configured to move in the X direction, and
a second stage configured to move in the Y direction.

(11) The electron gun component according to any one of (8) to (10) above, wherein the electrode kit includes an intermediate electrode arranged between the photocathode supporting part and the anode.

(12) An electron beam applicator including the electron gun according to any one of (1) to (7) above, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

(13) An alignment method for aligning an emission axis of an electron beam emitted from an electron gun with an optical axis of an electron optical system of an electron beam applicator,
wherein the electron gun includes
a light source,
a photocathode,
an electrode kit, and
an electrode kit drive device,
wherein the electrode kit includes
a photocathode supporting part, and
an anode arranged spaced apart from the photocathode supporting part,
wherein the electrode kit drive device moves the electrode kit in an X-Y plane, where one direction is defined as an X direction, a direction orthogonal to the X direction is defined as a Y direction, and a plane including the X direction and the Y direction is defined as the X-Y plane,
the alignment method comprising:
an electron beam emission step of irradiating the photocathode with light from the light source to cause the photocathode to emit an electron beam; and
an electron beam emission axis adjustment step of, while emitting the electron beam, using the electrode kit drive device to move the electrode kit on which the photocathode is placed and aligning the emission axis of the electron beam with the optical axis of the electron optical system of the electron beam applicator.

(14) The alignment method according to (13) above further comprising:
a photocathode alignment step of moving the electrode kit so that an irradiation position of the photocathode irradiated from the light source overlaps the center of the photocathode supporting part when viewed from a Z direction orthogonal to the X direction and the Y direction and aligning the photocathode and the electrode kit with each other; and
a photocathode placement step of placing the photocathode on the photocathode supporting part.

Advantageous Effect

Even when an electron gun is mounted at a position out of the optical axis of the electron optical system of a counterpart device, the emission axis of an electron beam can be adjusted.

DETAILED DESCRIPTION OF EMBODIMENTS

Figure 1:
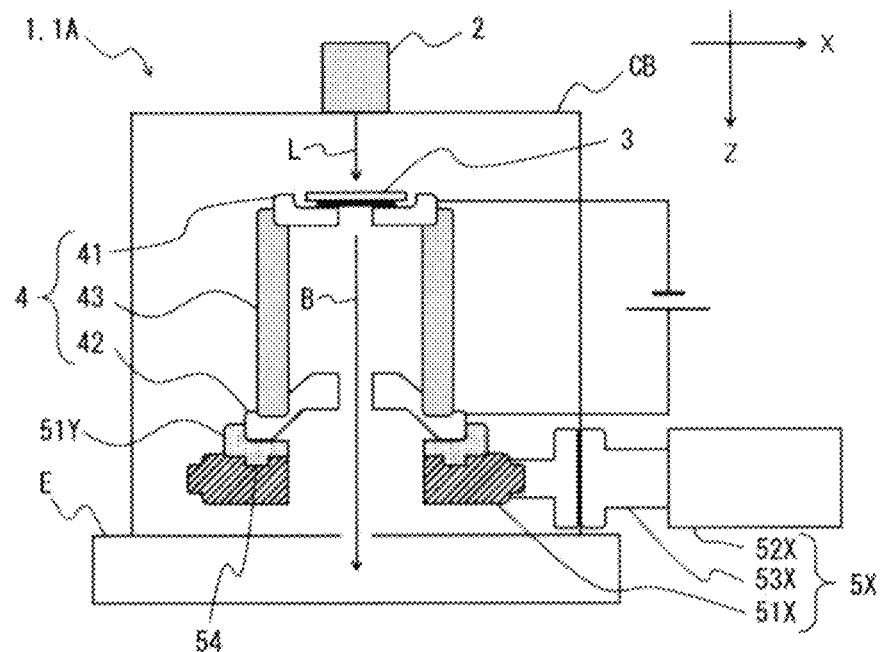
FIG. 1 is a diagram schematically illustrating an example of an electron gun 1A according to a first embodiment when viewed from a Y direction.

An electron gun, an electron gun component, an electron beam applicator, and an alignment method will be described below with reference to the drawings. Note that, in the present specification, members having the same type of functions are labeled with the same or similar references. Further, duplicated description for the members labeled with the same or similar references may be omitted.

Further, the position, size, range, or the like of respective components illustrated in the drawings may be depicted differently from the actual position, size, range, or the like for easier understanding. Thus, the disclosure in the present application is not necessarily limited to the position, size, range, or the like disclosed in the drawings.

Definition of Direction

In the present specification, in a three-dimensional orthogonal coordinate system with an X-axis, a Y-axis, and a Z-axis, a direction in which an electron beam emitted from a photocathode travels, is defined as a Z direction. Note that, while the Z direction is the perpendicularly downward direction, for example, the Z direction is not limited to the perpendicularly downward direction.

First Embodiment of Electron Gun

Figure 2A:
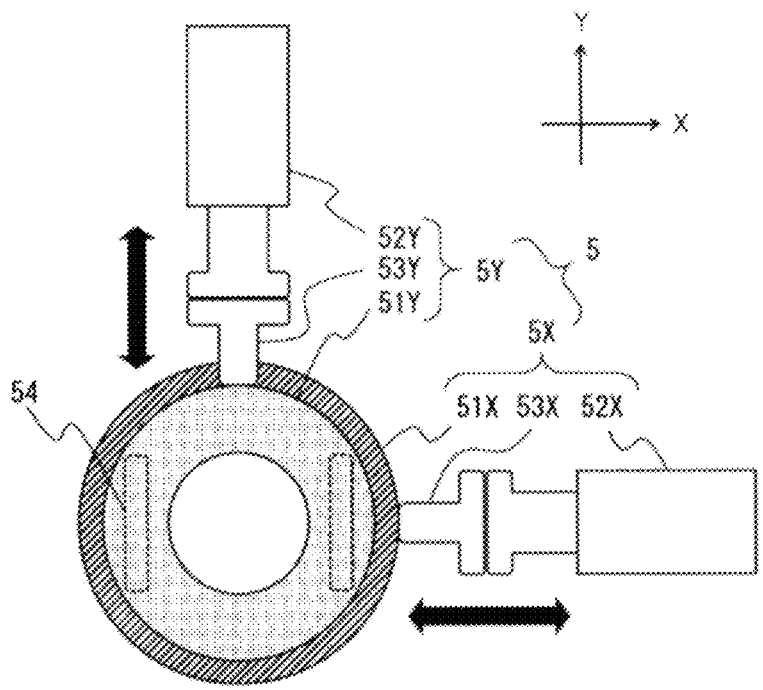
FIG. 2A is a diagram schematically illustrating an example of an electrode kit drive device 5 provided to the electron gun 1A according to the first embodiment when viewed from a Z direction.
Figure 2B:
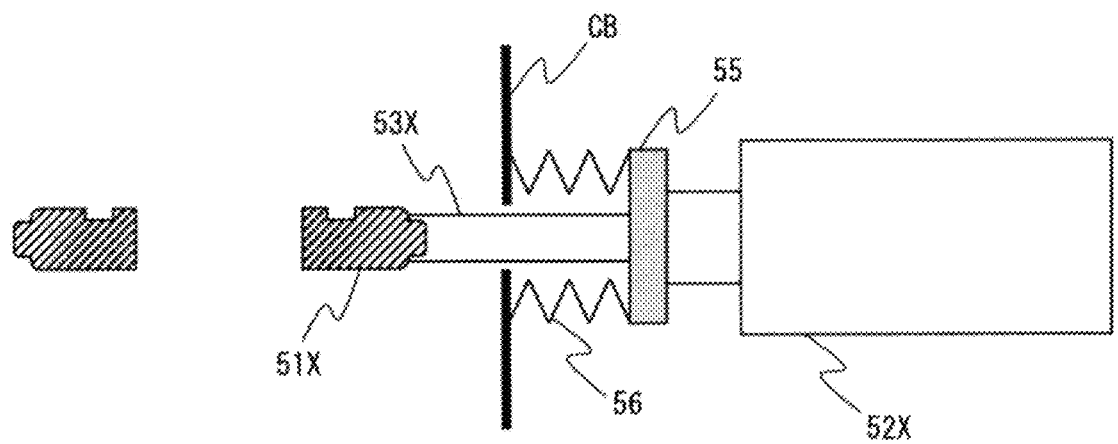
FIG. 2B is a diagram schematically illustrating an example in which motive power is transmitted from a drive source to a motive power transmission mechanism inside a vacuum chamber CB.
Figure 2C:
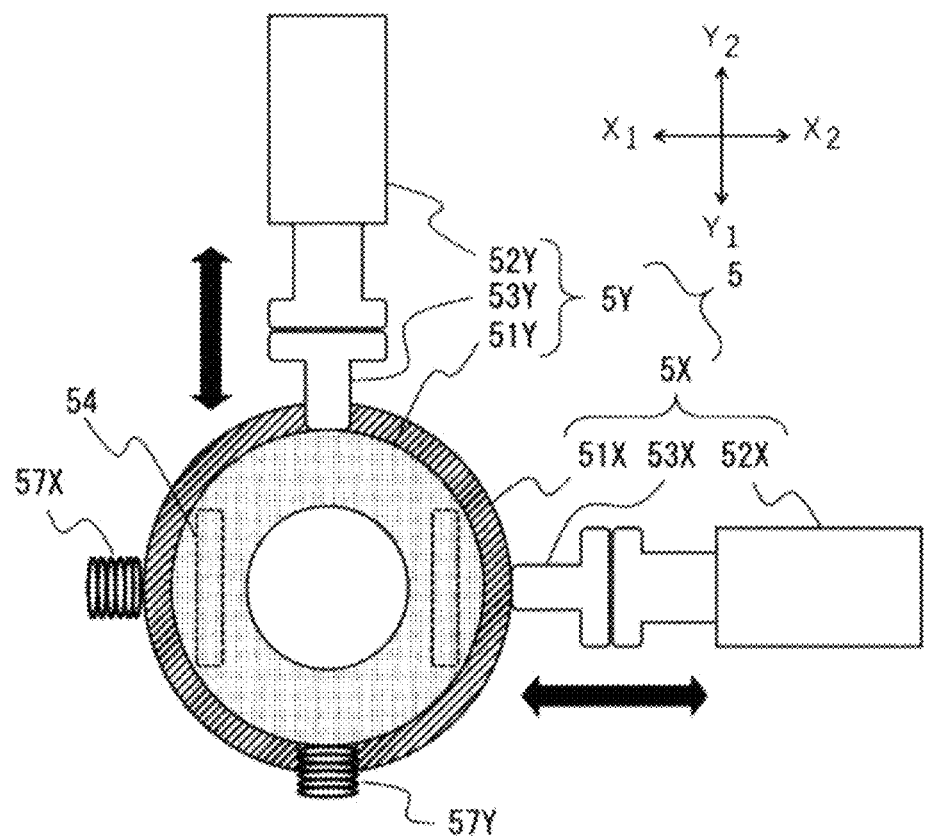
FIG. 2C is a diagram schematically illustrating another example of the electrode kit drive device 5 provided to the electron gun 1A according to the first embodiment when viewed from the Z direction.

An electron gun 1A according to the first embodiment will be described with reference to FIG. 1 and FIG. 2. FIG. 1 is a diagram schematically illustrating an example of the electron gun 1A according to the first embodiment when viewed from the Y direction. FIG. 2A is a diagram schematically illustrating an example of an electrode kit drive device 5 of the electron gun 1A according to the first embodiment when viewed from the Z direction. FIG. 2B is a diagram schematically illustrating an example in which motive power is transmitted from a drive source to a motive power transmission mechanism inside a vacuum chamber CB. FIG. 2C is a diagram schematically illustrating another example of the electrode kit drive device 5 of the electron gun 1A according to the first embodiment when viewed from the Z direction.

The electron gun 1A according to the first embodiment includes a light source 2, the vacuum chamber CB, a photocathode 3, an electrode kit 4, and the electrode kit drive device 5.

The light source 2 is not particularly limited as long as it can irradiate the photocathode 3 with excitation light L to cause emission of an electron beam B. The light source 2 may be, for example, a high power (watt class), high frequency (several hundred MHz), ultrashort pulse laser light source, a relatively inexpensive laser diode, an LED, or the like. The excitation light for irradiation can be either pulse light or continuous light and can be adjusted as appropriate in accordance with the purpose. In the example illustrated in FIG. 1, the light source 2 is arranged outside the vacuum chamber CB. Alternatively, the light source 2 may be arranged inside the vacuum chamber CB.

The vacuum chamber CB is a member for creating a vacuum atmosphere in the electron gun 1A. During use of the electron gun 1A, the pressure inside the vacuum chamber CB is set to $10^{-5}$ Pa or lower, for example. To reduce the pressure inside the vacuum chamber CB, a vacuum pump (not illustrated) is used. The vacuum pump is prepared separately from the electron gun 1A and connected to the electron gun 1A via piping, for example.

The shape of the vacuum chamber CB is not particularly limited and may be, for example, a cylindrical shape. Further, the material of the vacuum chamber CB may be, for example, a metal such as stainless steel, titanium, mu-metal, or the like or a non-metal such as glass, sapphire, ceramic, or the like.

The photocathode 3 is arranged inside the vacuum chamber CB. The photocathode 3 emits the electron beam B in response to receiving the excitation light L emitted from the light source 2. More specifically, electrons in the photocathode 3 are excited by the excitation light L, and the excited electrons are emitted from the photocathode 3. The emitted electrons are accelerated by an electric field generated between an anode 42 and a cathode (including the photocathode 3) and form the electron beam B. Although the backside of the photocathode 3 is irradiated with the excitation light L in the example illustrated in FIG. 1, alternatively, the front side of the photocathode 3 may be irradiated with the excitation light L. Note that, regarding the reference to "photocathode" and "cathode" in the present specification, "photocathode" may be used when the reference in question means emission of an electron beam, and "cathode" may be used when the reference in question means the counter electrode of an "anode". Regarding the reference numeral, "3" is used for both of "photocathode" and "cathode".

The photocathode 3 is formed of a substrate of a quartz glass, sapphire, or the like and a photocathode film adhered to the first face of the substrate (the face on the anode 42 side). The photocathode material for forming the photocathode film is not particularly limited as long as the photocathode can emit an electron beam by being irradiated with excitation light and may be a material requiring EA surface treatment, a material not requiring EA surface treatment, or the like. The material requiring EA surface treatment may be, for example, Group III-V semiconductor materials or Group II-VI semiconductor materials. Specifically, the material may be AlN, $Ce_2Te$, GaN, a compound of one or more types of alkaline metals and Sb, or AlAs, GaP, GaAs, GaSb, InAs, or the like, and a mixed crystal thereof, or the like. The material may be a metal as another example and specifically may be Mg, Cu, Nb, $LaB_6$, $SeB_6$, Ag, or the like. It is possible to fabricate the photocathode 3 by performing EA surface treatment on the photocathode material, and for the photocathode 3, suitable selection of the semiconductor material or the structure thereof makes it possible not only to select excitation light in a range of near-ultraviolet to infrared wavelengths in accordance with gap energy of the semiconductor but also to achieve electron beam source performance (quantum yield, durability, monochromaticity, time response, spin polarization) suitable for respective uses of the electron beam.

Further, the material not requiring EA surface treatment may be, for example, a single metal, an alloy, or a metal compound of Cu, Mg, Sm, Tb, Y, or the like or diamond, WBaO, $Cs_2Te$, or the like. The photocathode not requiring EA surface treatment can be fabricated by a known method (for example, see Japanese Patent No. 3537779 or the like). The content disclosed in Japanese Patent No. 3537779 is incorporated in the present specification by reference in its entirety.

The electrode kit 4 is arranged inside the vacuum chamber CB. The electrode kit 4 in the electron gun 1A according to the first embodiment includes a photocathode supporting part 41, an anode 42, and a fixing member 43.

The photocathode 3 is placed on the upper part of the photocathode supporting part 41. The shape of the photocathode supporting part 41 is not particularly limited as long as it can carry the photocathode 3 thereon and has a hole through which the electron beam B emitted from the photocathode 3 passes.

Further, in the electron gun 1A according to the first embodiment, an electric field is generated by the photocathode supporting part 41 on which the photocathode 3 is placed and the anode 42. It is thus preferable that the material forming the photocathode supporting part 41 be an electric conductor. The electric conductor may be made of a known material such as stainless steel, for example.

The anode 42 is not particularly limited as long as it can be used with the cathode 3 to generate an electric field, and an anode generally used in the field of electron guns can be used.

The fixing member 43 is to arrange the photocathode supporting part 41 and the anode 42 to be spaced apart from each other and fix the photocathode supporting part 41 and the anode 42 so that the relative position therebetween is unchanged. Thus, the photocathode supporting part 41 and the anode 42 are moved in an integrated manner inside the vacuum chamber CB by the electrode kit drive device 5 described later.

In the electron gun 1A according to the first embodiment, an electric field is generated by the photocathode supporting part 41 on which the photocathode 3 is placed and the anode 42. Accordingly, the fixing member 43 is formed of an insulating material so that the cathode supporting part 41 and the anode 42 are not short-circuited with each other. For example, the insulating material may be a known insulating material such as ceramic.

The electrode kit drive device 5 is not particularly limited as long as it can move the electrode kit 4 in the X-Y plane. The electrode kit drive device 5 of the electron gun 1A according to the first embodiment illustrated in FIG. 2A includes an X-direction drive device 5X and a Y-direction drive device 5Y. Further, the X-direction drive device 5X includes a first stage 51X, a first drive source 52X, and a first motive power transmission mechanism 53X, and the Y-direction drive device 5Y includes a second stage 51Y, a second drive source 52Y, and a second motive power transmission mechanism 53Y.

The first stage 51X and the second stage 51Y are arranged inside the vacuum chamber CB. In the example illustrated in FIG. 1 and FIG. 2A, the second stage 51Y is placed on the first stage 51X, and the electrode kit 4 is placed on the second stage 51Y. Further, the first stage 51X moves the second stage 51Y and the electrode kit 4 placed on the second stage 51Y in the X direction. Further, the second stage 51Y moves the electrode kit 4 in the Y direction. To allow the second stage 51Y to move independently in the Y direction in this state, guides 54 are provided between the first stage 51X and the second stage 51Y. Each guide 54 is not limited in the shape, the place, or the like as long as it can cause the second stage 51Y to move independently in the Y direction. FIG. 1 and FIG. 2A illustrate an example in which two grooves are formed in the first stage 51X, two protrusions are formed on the second stage 51Y, and the protrusions are fit into the grooves to enable slide motion in the Y direction. Note that, although the second stage 51Y is arranged on the first stage 51X in the example illustrated in FIG. 1 and FIG. 2A, there is no limitation in the positional relationship between the first stage 51X and the second stage 51Y. Thus, the first stage 51X may be arranged on the second stage 52Y. Further, the protrusions may be formed on the first stage 51X, and the grooves may be formed in the second stage 51Y.

The shape and the material of the first stage 51X and the second stage 51Y are not particularly limited as long as the first stage 51X and the second stage 51Y can carry the electrode kit 4 thereon and do not interfere with passage of the electron beam B emitted from the photocathode 3. For example, each material of the first stage 51X and the second stage 51Y may be a metal such as stainless steel or a non-metal such as ceramic. It is preferable that the first stage 51X and the second stage 51Y be a metal in terms of easy machining, because the guides are provided thereto and sliding motion takes place thereon. Further, surface treatment may be applied to the first stage 51X and the second stage 51Y by diamond-like carbon (DLC) or the like. Such surface treatment reduces the sliding motion induced friction and thus can reduce the load in the motion of the first stage 51X and the second stage 51Y. Furthermore, it is possible to prevent contamination inside the vacuum chamber CB due to a gas or the like caused by sliding motion of the first stage 51X and the second stage 51Y.

When the first stage 51X and the second stage 51Y are made of metal, the first stage 51X and the second stage 51Y will have electric conductivity. In general, in an electron gun, the anode 42 side is grounded in application of an electric potential between the cathode 3 and the anode 42. Thus, placement of the anode 42 on the first stage 51X and the second stage 51Y will electrically stabilize the first stage 51X and the second stage 51Y. It is therefore possible to prevent the electrode kit drive device 5 from being electrically affected.

The first drive source 52X and the second drive source 52Y are arranged outside the vacuum chamber CB. The first drive source 52X generates motive power that moves the first stage 51X, and the second drive source 52Y generates motive power that moves the second stage 52Y. The motive power is not particularly limited as long as it can move the first stage 51X via the first motive power transmission mechanism 53X and move the second stage 52Y via the second motive power transmission mechanism 53Y. The motive power generated from the first drive source 52X and the second drive source 52Y may be automatically generated or may be manually generated. A drive source that automatically generates motive power may be, for example, an actuator such as a pneumatic actuator, a hydraulic actuator, an electric actuator, a solenoid actuator, or the like. Further, a drive source that manually generates motive power may be, for example, a drive source with a screw mechanism.

Transmission of motive power from the first drive source 52X to the first motive power transmission mechanism 53X inside the vacuum chamber CB is not particularly limited as long as it can transmit motive power. For example, as illustrated in FIG. 2B, a hole-less wall 55 and an expansion and contraction member 56 such as a bellows may be used for transmission. In the example illustrated in FIG. 2B, one end of the expansion and contraction member 56 is secured to the hole-less wall 55. On the other hand, the other end of the expansion and contraction member 56 is secured so as to cover an insertion hole of a motive power transmission mechanism provided to the vacuum chamber CB. Thus, a vacuum of the vacuum chamber CB is maintained inside the expansion and contraction member 56 by the hole-less wall 55. Further, the first drive source 52X and the first motive power transmission mechanism 53X are connected via the hole-less wall 55. Transmission of motive power from the second drive source 52Y to the second motive power transmission mechanism 53Y can be performed in the same manner as the transmission of motive power from the first drive source 52X to the first motive power transmission mechanism 53X.

The first motive power transmission mechanism 53X transmits motive power generated by the first drive source 52X to the first stage 51X. The second motive power transmission mechanism 53Y transmits motive power generated by the second drive source 52Y to the second stage 51Y. The first motive power transmission mechanism 53X and the second motive power transmission mechanism 53Y are not particularly limited as long as they can transmit the motive power to the first stage 51X and the second stage 51Y, respectively. The first motive power transmission mechanism 53X and the second motive power transmission mechanism 53Y each may be, for example, a shaft, a gear mechanism, a screw mechanism, a link mechanism, a crank mechanism, or a joint mechanism such as a universal joint.

In the example illustrated in FIG. 2A, the first stage 51X is connected to the first motive power transmission mechanism 53X, and the second stage 51Y is connected to the second motive power transmission mechanism 53Y. Thus, motion of the first stage 51X in the X direction and motion of the second stage 51Y in the Y direction in FIG. 2A are all caused by motive power of the first drive source 52X and the second drive source 52Y.

Alternatively, although not illustrated, the electrode kit drive device 5 may include a third drive source and a third motive power transmission mechanism and include a fourth drive source and a fourth motive power transmission mechanism. The third drive source and the third motive power transmission mechanism are arranged at positions opposite to the first drive source 52X and the first motive power transmission mechanism 53X via the first stage 51X. Further, the fourth drive source and the fourth motive power transmission mechanism are arranged at positions opposite to the second drive source 52Y and the second motive power transmission mechanism 53Y via the second stage 51Y. In such a case, the first motive power transmission mechanism 53X and the third motive power transmission mechanism may not be connected to the first stage 51X. The first stage 51X is moved by being pushed by the first motive power transmission mechanism 53X or the third motive power transmission mechanism. The relationship between the set of the second drive source 52Y and the second motive power transmission mechanism 53Y and the set of the fourth drive source and the fourth motive power transmission mechanism is the same as the relationship between the set of the first drive source 52X and the first motive power transmission mechanism 53X and the set of the third drive source and the third motive power transmission mechanism. Note that the same drive sources as the first drive source 52X and the second drive source 52Y that have already been described above can be used for the third drive source and the fourth drive source. Further, the same motive power transmission mechanisms as the first motive power transmission mechanism 53X and the second motive power transmission mechanism 53Y that have already been described above can also be used for the third motive power transmission mechanism and the fourth motive power transmission mechanism.

Further, alternatively, the electrode kit drive device 5 may include a first resilient member 57X and a second resilient member 57Y as with the example illustrated in FIG. 2C. In the example illustrated in FIG. 2C, the first stage 51X is not connected to the first motive power transmission mechanism 53X, and the second stage 51Y is not connected to the second motive power transmission mechanism 53Y. Thus, for example, in the example illustrated in FIG. 2C, motion of the first stage 51X in the $X_1$ direction is caused by motive power from the first drive source 52X. On the other hand, motion of the first stage 51X in the $X_2$ direction is caused by elastic force of the first resilient member 57X instead of motive power from the first drive source 52X. It is therefore desirable that the first resilient member 57X and the first motive power transmission mechanism 53X be arranged at positions opposite to each other via the first stage 51X. The first resilient member 57X is not particularly limited as long as it can move the first stage 51X in the $X_2$ direction and may be, for example, a coil spring, a flat spring, or the like. The relationship between the second resilient member 57Y and the second motive power transmission mechanism 53Y is the same as the relationship between the first resilient member 57X and the first motive power transmission mechanism 53X.

Note that the electron gun 1A according to the first embodiment illustrated in FIG. 1 and FIG. 2A to FIG. 2C uses two drive devices (the X-direction drive device 5X and the Y-direction drive device 5Y) to move the electrode kit 4 in the X direction and the Y direction. Alternatively, the electrode kit drive device 5 may include two drive sources (X direction, Y direction) and two motive power transmission mechanisms (X direction, Y direction) for one stage to move the electrode kit 4 in the X-Y plane. Further, alternatively, the electrode kit drive device 5 may include one drive source and one motive power transmission mechanism for one or two stages to move the electrode kit 4 in the X-Y plane. When one motive power transmission mechanism is used, a gear or the like may be provided to the motive power transmission mechanism to move the stage in the X direction or the Y direction in a switching manner, for example.

Further, the electron gun 1A according to the first embodiment may include a deflection coil, a beam deflector, or the like (not illustrated) that can perform axis alignment by two-dimensional deflection. By combining the electrode kit drive device 5 with the deflection coil, a beam deflector, or the like, it is possible to align the emission axis of the electron beam B with the optical axis of the electron optical system of the counterpart device E even when the emission axis of the electron beam B is inclined relative to the X-Y plane.

Figure 3A:
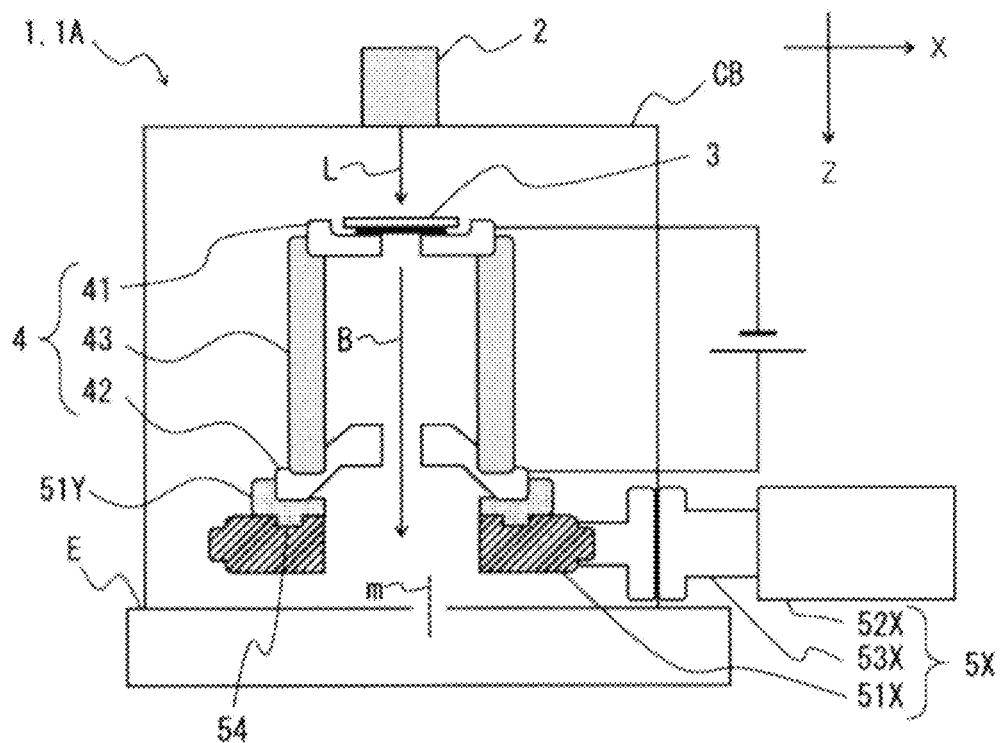
FIG. 3A is a diagram schematically illustrating an example of an electron beam emission step in alignment between the electron gun 1A and a counterpart device E according to the first embodiment when viewed from the Y direction.
Figure 3B:
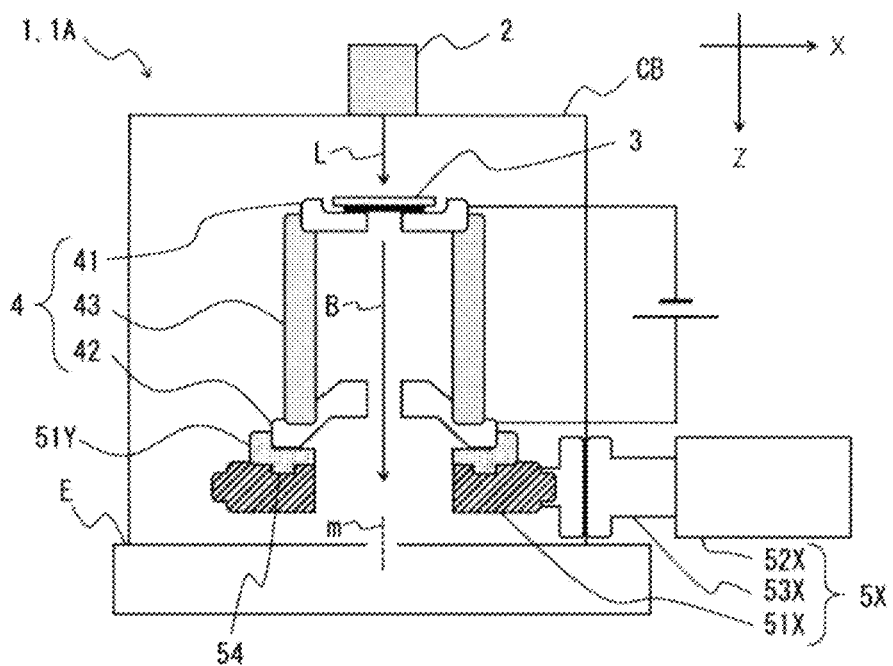
FIG. 3B is a diagram schematically illustrating an example of an electron beam emission axis adjustment step in alignment between the electron gun 1A and the counterpart device E according to the first embodiment when viewed from the Y direction.

First Embodiment of Alignment Method for Aligning Emission Axis of Electron Beam Emitted from Electron Gun with Optical Axis of Electron Optical System of Electron Beam Applicator A first embodiment of an alignment method for aligning the emission axis of the electron beam B emitted from the electron gun 1A with the optical axis of the electron optical system of the electron beam applicator E (hereafter, which may be referred to as an "alignment method") will be described with reference to FIG. 3A and FIG. 3B. FIG. 3A is a diagram schematically illustrating an example in which there is misalignment between the emission axis of the electron beam B from the electron gun 1A and the optical axis m of the electron optical system of the counterpart device E. FIG. 3B is a diagram schematically illustrating an example in which the emission axis of the electron beam B from the electron gun 1A is aligned with the optical axis m of the electron optical system of the counterpart device E.

The alignment method according to the first embodiment has (1) an electron beam emission step of irradiating the photocathode 3 with light from the light source 2 to cause the photocathode 3 to emit the electron beam B and (2) an electron beam emission axis adjustment step of, while emitting the electron beam B, using the electrode kit drive device 5 to move the electrode kit 4 on which the photocathode 3 is placed and aligning the emission axis of the electron beam B with the optical axis m of the electron optical system of the electron beam applicator.

The electron beam emission step is to irradiate the photocathode 3 placed on the photocathode supporting part 41 of the electrode kit 4 with the excitation light L from the light source 2 to cause the photocathode 3 to emit the electron beam B. At this time, when the electron gun 1A is mounted at a correct position relative to the counterpart device E, the electron beam B from the electron gun 1A can be detected by the counterpart device E. As illustrated in FIG. 3A, however, when the mounted position of the electron gun 1A to the counterpart device E is misaligned, the electron beam B is not detected at the counterpart device E. Otherwise, in a case of slight misalignment, a less amount of the electron beam is detected.

After the electron beam emission step, the electron beam emission axis adjustment step is performed. The electron beam emission axis adjustment step is to first use the electrode kit drive device 5 to move the electrode kit 4 in the X-Y plane while causing the electron beam B to be emitted. With the motion of the electrode kit 4, the electron beam B can be detected at the counterpart device E (or a more amount is detected). Note that this state means that the electron beam B enters the electron optical system of the counterpart device E, and the emission axis of the electron beam B and the optical axis m of the electron optical system of the counterpart device E are not aligned with each other.

At this time, since the photocathode 3 is placed on the photocathode supporting part 41, the photocathode 3 is also moved together with the electrode kit 4. Further, even when the electrode kit 4 is moved, the light source 2 can be moved in accordance with the motion of the electrode kit 4 so that the light source 2 can irradiate the photocathode 3 with the excitation light L. For example, a motion device may be provided to the light source 2, and the light source 2 can be moved in accordance with the distance that the electrode kit drive device 5 has moved.

After the electron beam B is detected by the counterpart device E, alignment between the emission axis of the electron beam B and the optical axis m of the electron optical system of the counterpart device E is performed. The alignment may be implemented by, for example, a method of moving the electrode kit 4 in the X direction and/or the Y direction while monitoring a current value detected by the counterpart device E. More specifically, when the counterpart device E includes a column including an aperture and when there is misalignment between the emission axis of the electron beam B and the optical axis m, the amount of electron beam blocked by the aperture out of the whole electron beam B will increase, and the current value detected by the aperture will thus increase. In contrast, when the emission axis of the electron beam B and the optical axis m are aligned with each other, the amount of electron beam blocked by the aperture out of the whole electron beam B will decrease, and the current value detected by the aperture will thus decrease. Alternatively, when the counterpart device E includes a Faraday cup, instead of detection by the aperture, monitoring may be performed in accordance with a current value detected by the Faraday cup. When the emission axis of the electron beam B and the optical axis m are aligned with each other to a greater degree, the current value detected by the Faraday cup will be larger. Further, alternatively, the monitoring performed by the counterpart device E may be performed by an instrument in accordance with the counterpart device E. For example, in a case of an electron microscope, the monitoring may be performed by using a contrast or astigmatism of an image captured by the electron microscope.

Conventionally, alignment between the emission axis of the electron beam B and the optical axis m of the electron optical system of the counterpart device E has been performed by changing an electric field or a magnetic field. In such a case, the outer portion of the electron beam B includes a low-quality part of the electron beam affected by the electric field or the magnetic field and thus is unable to be used in the counterpart device E. However, the alignment method according to the first embodiment mechanically moves the electrode kit 4. Thus, since the outer portion of the electron beam B is not affected by the electric field or the magnetic field, such a portion can also be used by the counterpart device E. Therefore, the usage efficiency of the electron beam B can be higher than in the conventional art. Thus, the alignment method according to the first embodiment makes it possible to obtain a bright image and high resolution.

The electron gun 1A and the alignment method according to the first embodiment achieve the following advantageous effects.

(1) The electron gun 1A according to the first embodiment includes the electrode kit drive device 5 that moves the electrode kit 4 integrating the photocathode supporting part 41 and the anode 42. Thus, even when the electron gun 1A is mounted at a position out of the optical axis m of the electron optical system of the counterpart device E, adjustment between the emission axis of the electron beam B and the optical axis m of the electron optical system of the counterpart device E can be performed.

(2) Since alignment between the emission axis of the electron beam B and the optical axis m of the electron optical system of the counterpart device E is mechanically performed, a bright image and high resolution can be obtained.

Second Embodiment of Electron Gun

Figure 4:
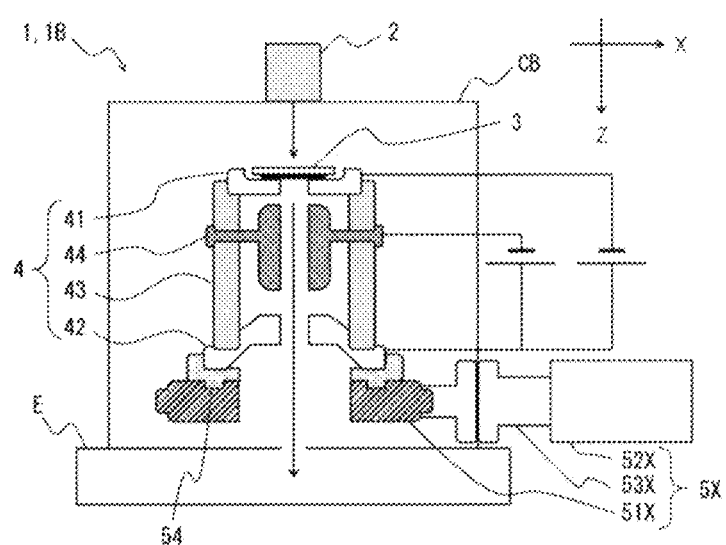
FIG. 4 is a diagram schematically illustrating an example of an electron gun 1B according to a second embodiment when viewed from the Y direction.
Figure 5:
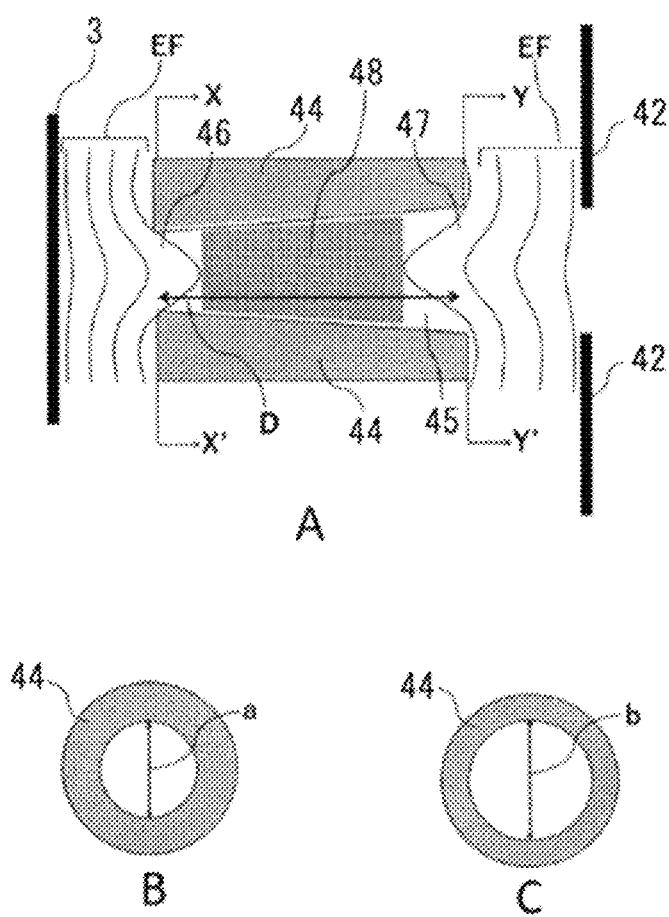
FIG. 5 is a diagram schematically illustrating an example of an intermediate electrode in the second embodiment.
Figure 6:
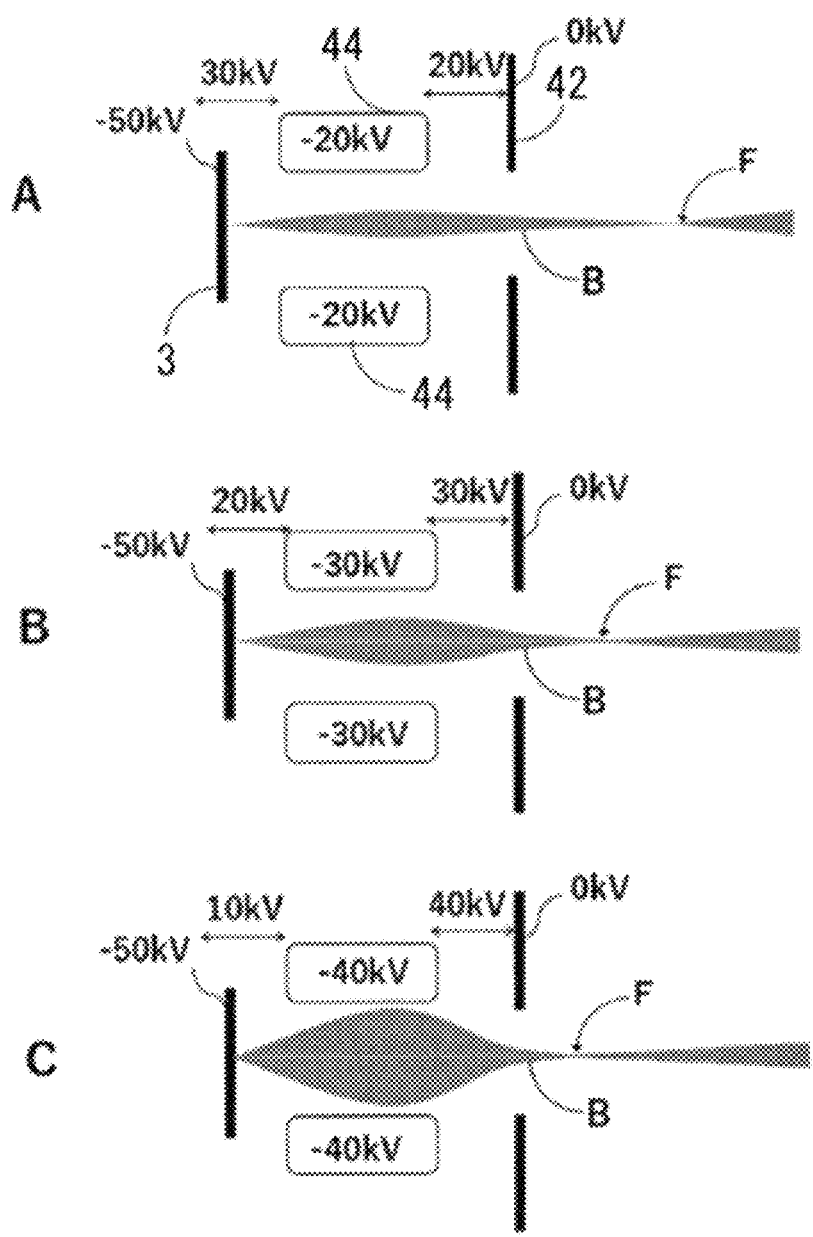
FIG. 6 is a diagram illustrating an example of focus distance adjustment.

An electron gun 1B according to the second embodiment will be described with reference to FIG. 4 to FIG. 6. FIG. 4 is a diagram schematically illustrating an example of the electron gun 1B according to the second embodiment when viewed from the Y direction. FIG. 5 is a diagram schematically illustrating an example of an intermediate electrode. FIG. 6 is a diagram illustrating an example of focus distance adjustment.

The electron gun 1B according to the second embodiment differs from the electron gun 1A according to the first embodiment in that the electrode kit 4 including an intermediate electrode 44 is provided, and other features are the same as those of the electron gun 1A. Accordingly, the electron gun 1B according to the second embodiment will be described mainly for features different from those in the first embodiment, and duplicated description for the features that have already been described in the first embodiment will be omitted. It is therefore apparent that any feature that has already been described in the first embodiment can be employed in the second embodiment even when not explicitly described herein.

In adjustment in mounting of the electron gun 1 to the counterpart device E, in addition to the alignment described above between the emission axis of the electron beam B and the optical axis m of the electron optical system of the counterpart device, focus alignment is also performed so that the electron beam B is focused at a desired position in the counterpart device E.

Accordingly, to align the focus of the electron beam B, the electrode kit 4 includes the intermediate electrode 44 in the electron gun 1B according to the second embodiment.

In the example illustrated in FIG. 4, the intermediate electrode 44 is arranged between the photocathode supporting part 41 and the anode 42 of the electrode kit 4 and fixed to the fixing member 43. Further, the intermediate electrode 44 has an electron beam passage hole 45 through which the electron beam B emitted from the photocathode 3 passes. The intermediate electrode 44 has a function of changing the width of the electron beam B passing through the electron beam passage hole 45 to adjust the focus distance of the electron beam B. Note that the relative distance between the photocathode supporting part 41 and the anode 42 may be variable as long as the intermediate electrode 44 is arranged between the photocathode supporting part 41 and the anode 42.

In the electron beam passage hole 45 of the intermediate electrode 44, a drift space in which the effect of the electric field formed due to the electric potential difference between the photocathode 3 and the anode 42 can be disregarded is formed. Further, a voltage which is positive relative to the voltage applied to the photocathode 3 and is negative relative to the voltage applied to the anode 42 is applied to the intermediate electrode 44.

FIG. 5A is a schematic sectional view of the cathode 3, the intermediate electrode 44, and the anode 42, FIG. 5B is a sectional view taken along X-X' of FIG. 5A, and FIG. 5C is a sectional view taken along Y-Y' of FIG. 5A. In the example illustrated in FIG. 5, the intermediate electrode 44 is formed of a hollow cylinder. In the interior of the intermediate electrode 44, the electron beam passage hole 45 through which the electron beam B emitted from the photocathode 3 passes is formed, and an electron beam entrance 46 is formed on the photocathode 3 side of the electron beam passage hole 45, and an electron beam exit 47 is formed on the anode 42 side of the electron beam passage hole 45. A voltage is applied between the cathode 3 and the anode 42 so that an electric potential difference is generated therebetween, a voltage is also applied to the intermediate electrode 44, and thereby an electric field EF is generated between the cathode 3 and the intermediate electrode 44 and between the intermediate electrode 44 and the anode 42, as illustrated in FIG. 5A.

When the opening of a void is circular, the range where the generated electric field EF intensively affects movement of the electron beam B within the void is shaped in a sphere including the circle of the opening as the maximum cross section. Thus, when $D/(a/2+b/2)$ is greater than 1, where the diameter of the electron beam entrance 46 illustrated in FIG. 5B is defined as a, the diameter of the electron beam exit 47 illustrated in FIG. 5C is defined as b, and the length in the center axis direction of the electron beam passage hole 45 is defined as D, a drift space 48 not affected by the electric field EF is formed within the electron beam passage hole 45. Note that, in the present specification, the "center axis direction" means a direction defined by connecting the center of the electron beam entrance 46 to the center of the electron beam exit 47.

The material from which the intermediate electrode 44 is fabricated is not particularly limited as long as it is a conductor and may be a metal such as stainless steel (SUS), or the like.

FIG. 6 illustrates an example in which focus position adjustment is performed including examples in which the voltage difference applied between the cathode 3 and the anode 42 is constant, the voltage applied to the intermediate electrode 44 is changed, and thereby the focus position is adjusted. As illustrated in FIG. 6A to FIG. 6C, the voltage of the cathode 3 is set to −50 kV, the voltage of the anode 42 is set to 0 kV, and −20 kV, −30 kV, and −40 kV are applied to the intermediate electrode 44 in FIG. 6A, FIG. 6B, and FIG. 6C, respectively. Accordingly, the voltage difference between the cathode 3 and the intermediate electrode 44 is 30 kV in FIG. 6A, 20 kV in FIG. 6B, and 10 kV in FIG. 6C. That is, when the voltage applied to the intermediate electrode 44 is closer to the voltage of the cathode 3, the electric potential difference between the cathode 3 and the intermediate electrode 44 will be smaller. Further, when the electric potential difference is smaller, the density of equipotential lines between the cathode 3 and the intermediate electrode 44 will be smaller, and therefore, the electron beam B emitted from the photocathode 3 is more likely to spread toward the intermediate electrode 44 in the order of FIG. 6A to FIG. 6C. Furthermore, since the drift space is formed in the intermediate electrode 44, the electron beam B that tends to spread further spreads within the drift space.

In contrast, since the electric potential difference between the cathode 3 and the anode 42 is constant, the electric potential difference between the intermediate electrode 44 and the anode 42 occurs in an opposite manner to the electric potential difference between the cathode 3 and the intermediate electrode 44. That is, since the electric potential difference between the intermediate electrode 44 and the anode 42 increases in the order of FIG. 6A to FIG. 6C, the density of equipotential lines between the intermediate electrode 44 and the anode 42 also increases accordingly. Furthermore, since the width of an electron beam after exiting the drift space increases in the order of FIG. 6A to FIG. 6C, the electron beam B exiting the intermediate electrode 44 is more likely to be converged in the example illustrated in FIG. 6C than in the example illustrated in FIG. 6A. That is, a larger electric potential difference between the intermediate electrode 44 and the anode 42 can move the focus position F closer to the short focus side. Further, it is also possible to perform focus position adjustment by changing the position or the size of the intermediate electrode 44. The intermediate electrode 44 is disclosed in more detail in Japanese Patent No. 6466020, and the content disclosed in Japanese Patent No. 6466020 is incorporated in the present specification.

Second Embodiment of Alignment Method

An alignment method according to the second embodiment will be described. The alignment method according to the second embodiment differs from the alignment method according to the first embodiment in that the alignment is performed with the electron gun 1B in which the electrode kit 4 includes the intermediate electrode 44, and other features are the same as those of the alignment method according to the first embodiment. Accordingly, the alignment method according to the second embodiment will be described mainly for features different from those in the first embodiment, and duplicated description for the features that have already been described in the first embodiment will be omitted. It is therefore apparent that, even when not explicitly described in the embodiment of the alignment method according to the second embodiment, any feature that has already been described in the first embodiment can be employed herein.

The intermediate electrode 44 provided to the electron gun 1B is arranged to the fixing member 43. Thus, the intermediate electrode 44 is moved together with the photocathode supporting part 41 and the anode 42 by the electrode kit drive device 5. Therefore, alignment between the emission axis of the electron beam B from the electron gun 1B and the optical axis m of the electron optical system of the counterpart device E can be performed in the same step as that in the alignment method according to the first embodiment described above.

Further, the alignment method according to the second embodiment has a focus position adjustment step of adjusting the focus position of an electron beam. The focus position adjustment step is performed after the electron beam emission axis adjustment step. The focus position adjustment step can focus the focus position of the electron beam B with a desired position by applying an electric potential to the intermediate electrode 44, as described above.

The electron gun 1B and the alignment method according to the second embodiment achieve the following advantageous effects synergistically in addition to the advantageous effects achieved by the electron gun 1A and the alignment method according to the first embodiment. (1) The electron gun 1B according to the second embodiment includes the intermediate electrode 44. Therefore, even after the electron gun is mounted to the counterpart device, the focus position of an electron beam can be adjusted in any direction on the short focus side or the long focus side.

Third Embodiment of Electron Gun

Figure 7:
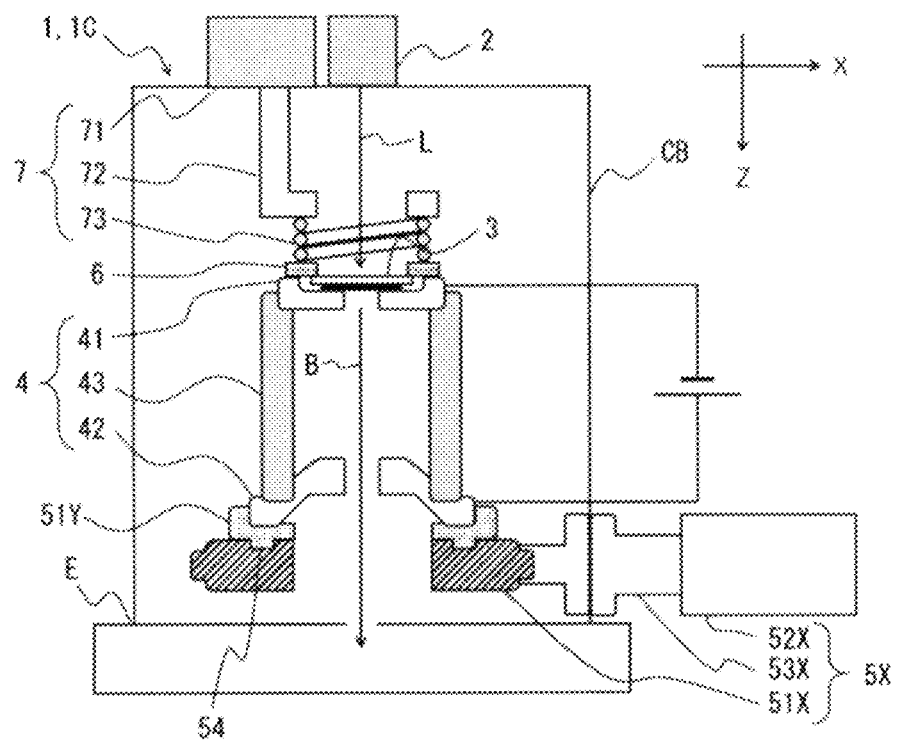
FIG. 7 is a diagram schematically illustrating an example of an electron gun 1C according to a third embodiment when viewed from the Y direction.

An electron gun 1C according to the third embodiment will be described with reference to FIG. 7. FIG. 7 is a diagram schematically illustrating an example of the electron gun 1C according to the third embodiment when viewed from the Y direction.

The electron gun 1C according to the third embodiment differs from the electron gun 1A according to the first embodiment in that a photocathode drive device 7 is provided as an essential component and, optionally, a photocathode holder 6 is further provided, and other features are the same as those in the first embodiment. Accordingly, the electron gun 1C according to the third embodiment will be described mainly for features different from those in the first embodiment, and duplicated description for the features that have already been described in the first embodiment will be omitted. It is thus apparent that, even when not explicitly described in the third embodiment, any feature that has already been described in the first embodiment can be employed in the third embodiment. Further, it is apparent that, although the example illustrated in FIG. 7 is described with reference to the first embodiment, the third embodiment can also employ any feature that has already been described in the second embodiment.

In the electron gun 1C according to the third embodiment, the photocathode holder 6 is an optional component. The photocathode 3 may be any component that is moved in the Z direction by the photocathode drive device 7 described later, and the photocathode 3 may be directly held by the photocathode drive device 7.

The photocathode holder 6 is arranged inside the vacuum chamber CB and holds the photocathode 3. The photocathode holder 6 places the photocathode 3 on the photocathode supporting part 41 of the electrode kit 4 while holding the photocathode 3.

Note that the material of the photocathode holder 6 is not particularly limited and may be, for example, molybdenum, titanium, tantalum, stainless steel, or the like.

The photocathode holder 6 is attached to the photocathode drive device 7. Further, the photocathode holder 6 and the photocathode 3 are moved in the Z direction. The photocathode drive device 7 includes a fifth drive source 71, a fifth motive power transmission mechanism 72, and a pressing member 73.

The fifth drive source 71 generates motive power that moves the photocathode holder 6 and the photocathode 3 in the Z direction. The motive power is not particularly limited as long as it can move the photocathode holder 6 and the photocathode 3 via the fifth motive power transmission mechanism 72. The same drive source as the first drive source 52X or the second drive source 52Y that has already been described in the above first embodiment can be used.

The fifth motive power transmission mechanism 72 transmits motive power generated by the fifth drive source 71 to the photocathode holder 6 and the photocathode 3. The fifth motive power transmission mechanism 72 is not particularly limited as long as it can transmit motive power to the photocathode holder 6 and the photocathode 3. The same mechanism as the first motive power transmission mechanism 53X or the second motive power transmission mechanism 53Y that has already been described in the above first embodiment can be used.

The pressing member 73 is to press the photocathode holder 6 and the photocathode 3 in the Z direction. In the electron gun 1C according to the third embodiment, the photocathode and the photocathode supporting part 41 function as the cathode 3. It is thus desirable that the photocathode 3 be reliably in contact with the photocathode supporting part 41. Since the pressing member 73 presses the photocathode holder 6 and the photocathode 3 downward in the Z direction, the photocathode 3 and the photocathode supporting part 41 can be reliably in contact with each other.

Note that it is desirable to configure the pressing member 73 not only to cause the photocathode 3 and the photocathode supporting part 41 to be in contact with each other by pressing but also to enable the photocathode 3 to follow the photocathode supporting part 41 in accordance with the motion of the electrode kit 4. The pressing member 73 may be a member having a spring-like shape, a bar-like shape, or the like and made of a material such as a metal, an elastomer, or the like without being limited thereto.

Third Embodiment of Alignment Method

Figure 8A:
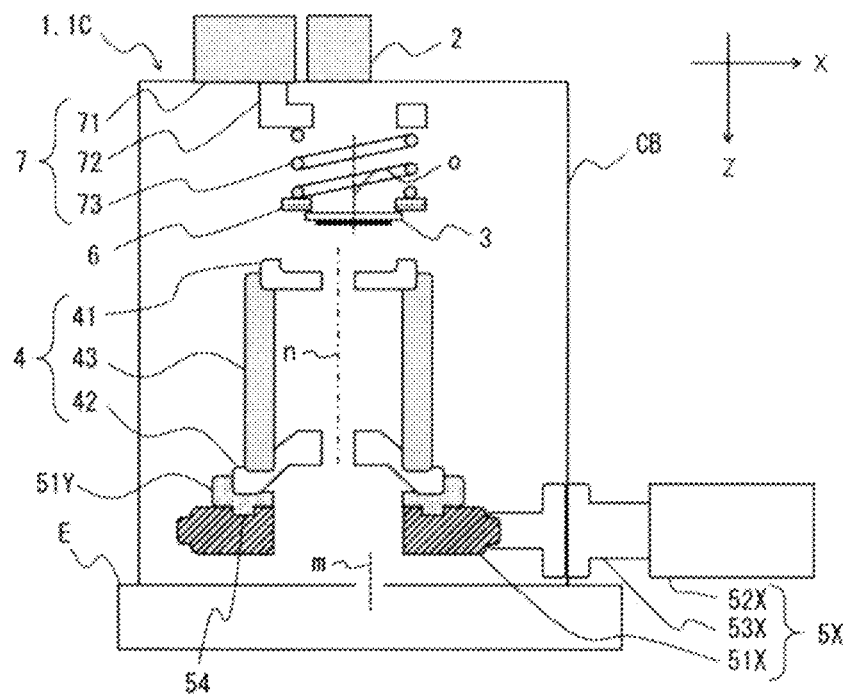
FIG. 8A is a diagram schematically illustrating the electron gun 1C and the counterpart device E before alignment between the electron gun 1C and the counterpart device E according to the third embodiment when viewed from the Y direction.
Figure 8B:
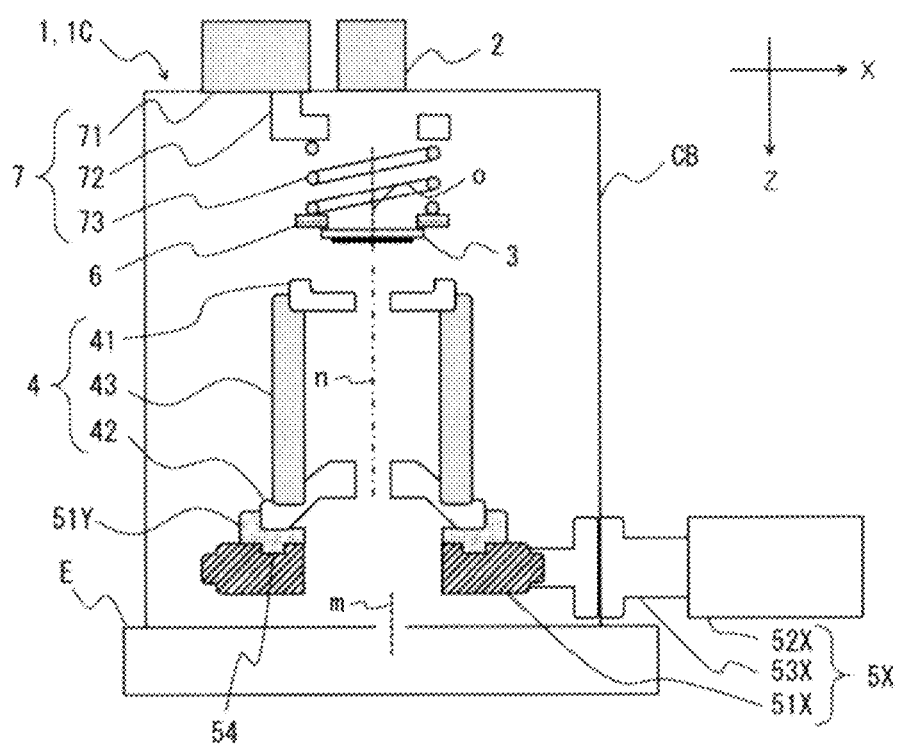
FIG. 8B is a diagram schematically illustrating an example of a photocathode alignment step in alignment between the electron gun 1C and the counterpart device E according to the third embodiment when viewed from the Y direction.
Figure 8C:
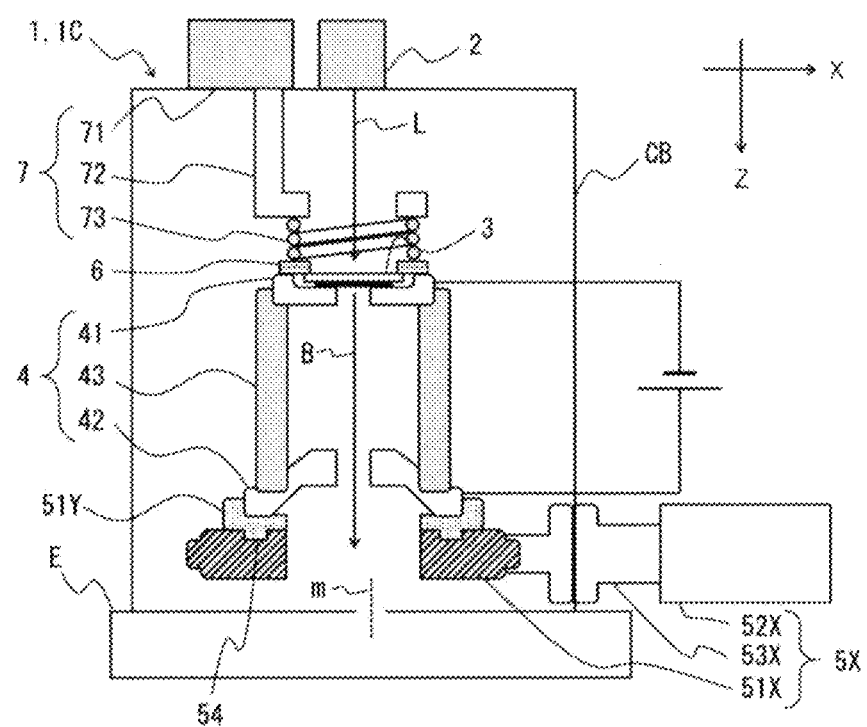
FIG. 8C is a diagram schematically illustrating an example of an electron beam emission step in alignment between the electron gun 1C and the counterpart device E according to the third embodiment when viewed from the Y direction.
Figure 8D:
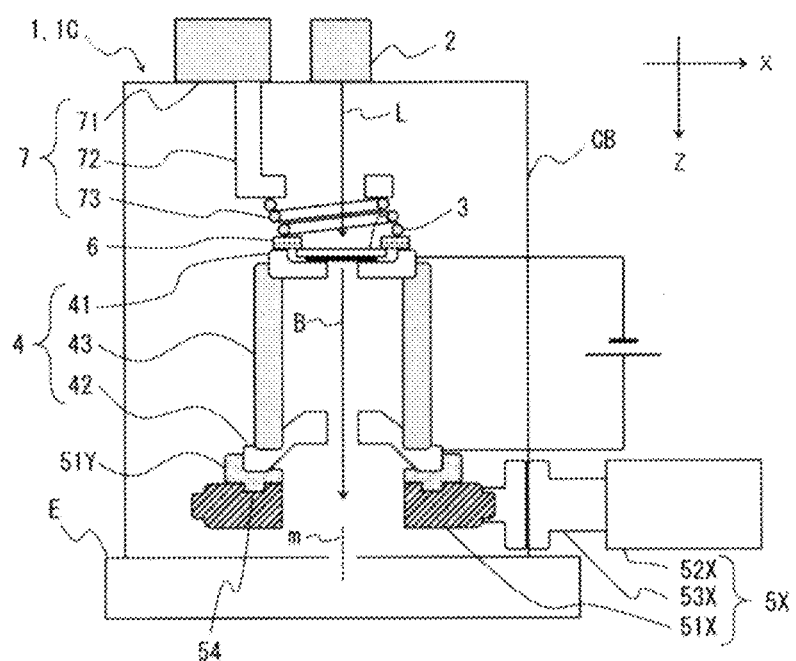
FIG. 8D is a diagram schematically illustrating an example of an electron beam emission axis adjustment step in alignment between the electron gun 1C and the counterpart device E according to the third embodiment when viewed from the Y direction.

An alignment method according to the third embodiment will be described with reference to FIG. 8A to FIG. 8D. FIG. 8A is a diagram schematically illustrating an example in which there is misalignment between the center axis o of the photocathode 3 and the center axis n of the photocathode supporting part 41. FIG. 8B is a diagram schematically illustrating an example in which the center axis o of the photocathode 3 is aligned with the center axis n of the photocathode supporting part 41. FIG. 8C is a diagram schematically illustrating an example in which, after the center axis o of the photocathode 3 has been aligned with the center axis n of the photocathode supporting part 41, the photocathode 3 is placed on the photocathode supporting part 41, and the electron beam B is then emitted. FIG. 8D is a diagram schematically illustrating an example in which the emission axis of the electron beam B from the electron gun 1C is aligned with the optical axis m of the electron optical system of the counterpart device E.

The alignment method according to the third embodiment differs from the alignment method according to the first embodiment in that the alignment is performed with the electron gun 1C including the photocathode holder 6 and the photocathode drive device 7, and other features are the same as those of the alignment method according to the first embodiment. Accordingly, the alignment method according to the third embodiment will be described mainly for features different from those in the first embodiment, and duplicated description for the features that have already been described in the first embodiment will be omitted. It is therefore apparent that, even when not explicitly described in the third embodiment, any feature that has already been described in the first embodiment can be employed in the third embodiment. Further, it is apparent that, although the example illustrated in FIG. 8A to FIG. 8D is described with reference to the first embodiment, the third embodiment can also employ any feature that has already been described in the second embodiment.

In mounting the electron gun 1 to the counterpart device E, it may be required to perform adjustment of the placement position of the photocathode 3 in addition to alignment with the optical axis m of the electron optical system of the counterpart device E. Further, the electron gun 1C may require adjustment of the position of the photocathode 3 after the photocathode 3 has been replaced or EA surface retreatment has been performed thereon.

The alignment method according to the third embodiment has (3) a photocathode alignment step of moving the electrode kit 4 so that the irradiation position of the photocathode 3 irradiated from the light source 2 overlaps the center of the photocathode supporting part 41 when viewed from the Z direction and thereby aligning the photocathode 3 and the electrode kit 4 with each other and (4) a photocathode placement step of placing the photocathode 3 on the photocathode supporting part 41, in addition to (1) the electron beam emission step and (2) the electron beam emission axis adjustment step as described in the alignment method according to the above first embodiment.

Further, the alignment method according to the third embodiment is performed in the order of (3) the photocathode alignment step, (4) the photocathode placement step, (1) the electron beam emission step, and (2) the electron beam emission axis adjustment step.

The photocathode alignment step is a step of aligning the center of the photocathode 3, which is the irradiation position irradiated from the light source 2, with the center axis n of the photocathode supporting part 41. In the example illustrated in FIG. 8A, the center axis o of the photocathode 3 and the center axis n of the photocathode supporting part 41 are misaligned with each other. In this state, the photocathode 3 is held by the photocathode holder 6 and located above in the Z direction and is not placed on the photocathode supporting part 41 of the electrode kit 4.

The photocathode drive device 7 moves only in the Z direction. Thus, alignment between the center axis o of the photocathode 3 and the center axis n of the photocathode supporting part 41 is performed by moving the electrode kit 4 in the X-Y plane relative to the center axis o of the photocathode 3.

Determination as to whether or not the center axis n of the photocathode supporting part 41 overlaps the center axis o of the photocathode 3 is performed while monitoring is performed by an image capturing device such as a camera (not illustrated) arranged lower in the Z direction than the first stage 51X, for example.

FIG. 8B illustrates an example of the electron gun 1C after the photocathode alignment step has been performed. That is, this illustrates a state where the center axis o of the photocathode 3 and the center axis n of the photocathode supporting part 41 are aligned with each other.

The photocathode alignment step may be performed before the electron gun 1C is mounted to the counterpart device E or after the electron gun 1C is mounted to the counterpart device E. FIG. 8A and FIG. 8B illustrate examples in which the photocathode alignment step is performed after mounting to the counterpart device E. When the photocathode alignment step is performed after the electron gun 1C is mounted to the counterpart device E, the image capturing device is provided inside the vacuum chamber CB. Further, when the photocathode alignment step is performed before the electron gun 1C is mounted to the counterpart device E, the image capturing device may be provided inside the vacuum chamber CB. Alternatively, instead of being provided inside the vacuum chamber CB, the image capturing device may be arranged outside the vacuum chamber CB for monitoring.

The photocathode placement step is a step of placing the photocathode 3 on the photocathode supporting part 41. In the alignment method according to the third embodiment, the photocathode holder 6 and the photocathode 3 are moved downward in the Z direction by the photocathode drive device 7. The center axis o of the photocathode 3 and the center axis n of the photocathode supporting part 41 have already been aligned with each other. It is therefore possible to place the photocathode 3 on the center of the photocathode supporting part 41 by merely moving the photocathode holder 6 and the photocathode 3. Further, in this process, the photocathode 3 is pressed against the pressing member 73 and comes into contact with the photocathode supporting part 41.

Further, the photocathode supporting part 41 may include a guide (not illustrated) so that the center axis o of the photocathode 3 is not misaligned with the center axis n of the photocathode supporting part 41 due to motion of the photocathode 3 downward in the Z direction. The guide may be any part that can align the center axis o of the photocathode 3 with the center axis n of the photocathode supporting part 41 in accordance with the motion of the photocathode 3 downward in the Z direction. An example of the guide may be of a tapered shape having a wider upper side in the Z direction.

Next, the electron beam emission step is performed. FIG. 8C illustrates an example in which, after the photocathode placement step, the photocathode 3 is irradiated with the excitation light L from the light source 2, and the electron beam B is emitted.

After the electron beam emission step is performed, the electron beam emission axis adjustment step is performed. Since the electron beam emission axis adjustment step has been described in the alignment according to the above first embodiment, description for the alignment between the emission axis of the electron beam B and the optical axis m of the electron optical system of the counterpart device E will be omitted. The alignment method according to the third embodiment is performed in the electron gun 1C. The photocathode 3 in the electron gun 1C is placed on the photocathode supporting part 41 while pressed by the pressing member 73.

In the electron beam emission axis adjustment step, the photocathode 3 is required to follow the motion of the electrode kit 4 while emitting the electron beam B. Thus, the pressing member 73 of the electron gun 1C according to the third embodiment preferably presses the photocathode 3 and the photocathode holder 6 downward in the Z direction and causes the photocathode 3 to follow the motion of the electrode kit 4. In the examples illustrated in FIG. 7 and FIG. 8A to FIG. 8D, the spring-like pressing member 73 is used. Therefore, the pressing member 73 can be also moved in the X-Y plane even when compressed in Z direction. Thus, the photocathode 3 can follow the motion of the electrode kit 4 while placed on the photocathode supporting part 41.

Further, in the electron gun 1C according to the third embodiment, when the photocathode 3 is replaced or EA surface retreatment is performed thereon, the photocathode 3 is moved upward in the Z direction by the photocathode drive device 7. In response, the photocathode 3 that has followed the motion of the electrode kit 4 in the electron beam emission axis adjustment step will be moved back to the original position. That is, the center axis o of the photocathode 3 and the center axis n of the photocathode supporting part 41 have been misaligned with each other. Therefore, each step from the photocathode alignment step is performed again so that the electron beam B is detected by the counterpart device E. In this process, when the image capturing device is provided inside the vacuum chamber CB, alignment can be performed with monitoring being performed by the image capturing device in the photocathode re-alignment step. On the other hand, when the image capturing device is not provided inside the vacuum chamber CB, a position aligned by the electrode kit drive device 5 can be stored in the first photocathode alignment step. For example, when the electrode kit drive device 5 is configured to be automatically driven, the electron gun 1C may include a storage unit (not illustrated), and the aligned position may be stored in the storage unit. Further, when the electrode kit drive device 5 is configured to be manually driven, a displacement may be read and stored (recorded) by a scale or the like.

The electron gun 1C and the alignment method according to the third embodiment achieve the following advantageous effects synergistically in addition to the advantageous effects achieved by the electron guns 1A and 1B and the alignment methods according to the first and second embodiments.

(1) Since the electrode kit drive device 5 is provided, alignment between the photocathode 3 and the electrode kit 4 can be performed.
(2) Since the photocathode drive device 7 includes the pressing member 73, the photocathode 3 can be placed on the photocathode supporting part 41 in reliable contact therewith.
(3) The photocathode 3 can follow the motion of the electrode kit 4 while the photocathode 3 is pressed in the Z direction. Therefore, alignment between the emission axis of the electron beam B and the optical axis m of the electron optical system of the counterpart device E can be performed while emission of the electron beam B is maintained.

Fourth Embodiment of Electron Gun

Figure 9:
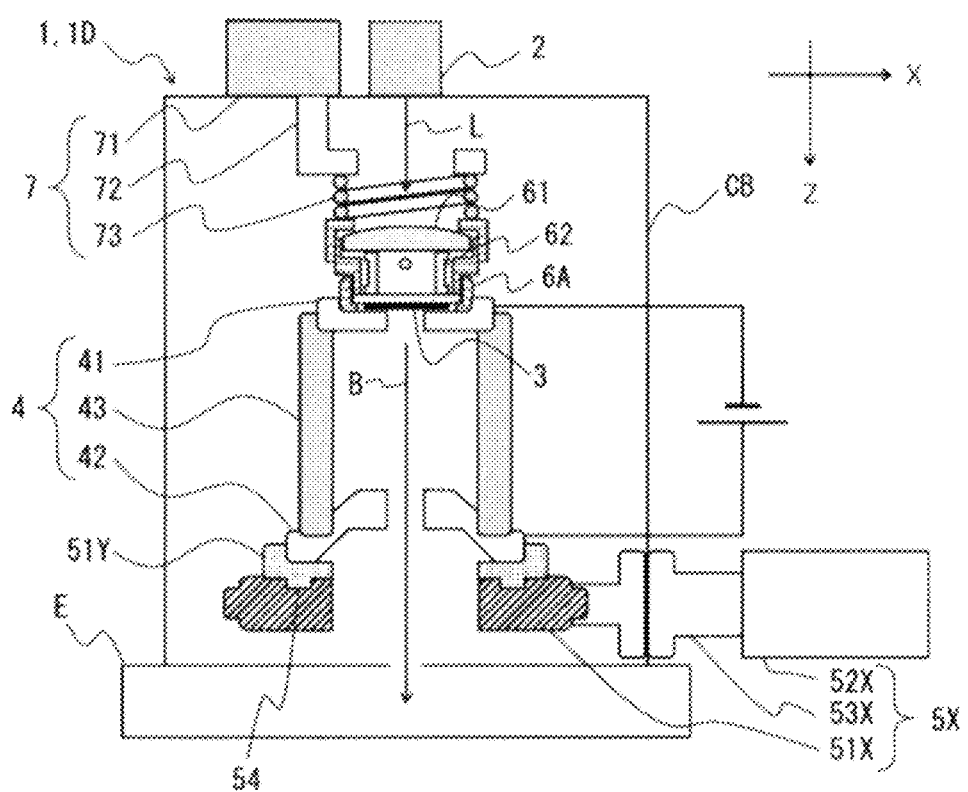
FIG. 9 is a diagram schematically illustrating an example of an electron gun 1D according to a fourth embodiment when viewed from the Y direction.

An electron gun 1D according to the fourth embodiment will be described with reference to FIG. 9. FIG. 9 is a diagram schematically illustrating an example of the electron gun 1D according to the fourth embodiment when viewed from the Y direction.

The electron gun 1D according to the fourth embodiment differs from the electron gun 1C according to the third embodiment in that a photocathode holder 6A including a lens 62 is further provided, and other features are the same as those in the third embodiment. Accordingly, the electron gun 1D according to the fourth embodiment will be described mainly for features different from those in the third embodiment, and duplicated description for the features that have already been described in the third embodiment will be omitted. It is thus apparent that, even when not explicitly described in the fourth embodiment, any feature that has already been described in the third embodiment can be employed in the fourth embodiment. Further, it is apparent that, although the example illustrated in FIG. 9 is described with reference to the third embodiment, the fourth embodiment can also employ any feature that has already been described in the first or second embodiment.

The photocathode 3 of the electron gun 1 may also be irradiated with the excitation light L via a lens. The lens is to converge the excitation light L from the light source 2 on the photocathode 3. The converged excitation light L is focused on the photocathode 3, and the electron beam B is emitted from the photocathode 3. Thus, in installing the photocathode 3 to the electron gun 1, position adjustment of the photocathode 3 relative to the lens is typically required.

The electron gun 1D according to the fourth embodiment includes the photocathode holder 6A including the lens 61. The lens 61 is held by the photocathode holder 6A at a position to be focused on the photocathode 3. In the example illustrated in FIG. 9 represents an example in which a spacer 62 is provided between the photocathode 3 and the lens 61. Note that further details of the photocathode holder 6A are described in Japanese Patent No. 6679014, and the content disclosed in Japanese Patent No. 6679014 is incorporated in the present specification.

Therefore, with the photocathode holder 6A being arranged in the optical path of the excitation light L, the lens 61 can always be focused on the photocathode 3 without position adjustment between the photocathode 3 and the lens 61.

Further, the lens 61 is focused on the photocathode 3 by the photocathode holder 6A. Thus, even when there is misalignment between the optical axis of the excitation light L and the center of the photocathode 3, when the misalignment is small, the effect of the misalignment can be ignored, and the electron beam B can be emitted from the center of the photocathode 3.

Fourth Embodiment of Alignment Method

An alignment method according to the fourth embodiment will be described. The alignment method according to the fourth embodiment differs from the alignment method according to the third embodiment in that the alignment is performed with the electron gun 1D including the photocathode holder 6A including the lens 61, and other features are the same as those of the alignment method according to the third embodiment. Accordingly, the alignment method according to the fourth embodiment will be described mainly for features different from those in the third embodiment, and duplicated description for the features that have already been described in the third embodiment will be omitted. It is therefore apparent that, even when not explicitly described in the embodiment of the alignment method according to the fourth embodiment, any feature that has already been described in the third embodiment can be employed herein. Further, it is apparent that the fourth embodiment can also employ any feature that has already been described in the first or second embodiment.

In the example illustrated in FIG. 9, the photocathode holder 6A and the photocathode 3 are pressed by the pressing member 73. Thus, in aligning the emission axis of the electron beam B with the optical axis m of the electron optical system of the counterpart device E, the photocathode 3 can be moved to follow the motion of the electrode kit 4.

Further, the photocathode holder 6A holding the photocathode 3 includes the lens 61. Thus, when the misalignment between the optical axis of the excitation light L and the center of the photocathode 3 is small, the electron beam B can be emitted from the center of the photocathode 3, as described above. Therefore, in aligning the emission axis of the electron beam B with the optical axis m of the electron optical system of the counterpart device E, since misalignment between the optical axis of the excitation light L and the center of the photocathode 3 is small when the motion of the electrode kit 4 is small, the electron beam B can be emitted without any motion of the light source 2. Note that, in aligning the emission axis of the electron beam B with the optical axis m of the electron optical system of the counterpart device E, the light source 2 may be moved as needed when the motion of the electrode kit 4 is larger.

The electron gun 1D and the alignment method according to the fourth embodiment achieve the following advantageous effects synergistically in addition to the advantageous effects achieved by the electron guns 1A to 1C and the alignment methods according to the first to third embodiments.

(1) The photocathode holder 6A includes the lens 61. Therefore, the lens 61 can always be focused on the photocathode 3 without position adjustment of the photocathode 3 and the lens 61.

(2) Even when the photocathode 3 is moved to follow the motion of the electrode kit 4, the excitation light L is focused on the photocathode 3 by the lens 61. Thus, when the motion of the electrode kit 4 is small, it may be unnecessary to move the light source 2 in accordance with the motion of the electrode kit 4.

Embodiment of Electron Gun Component

In the electron guns 1A to 1D in the above embodiments, existing components for electron guns, as they are, can be used for the light source 2, the vacuum chamber CB, the photocathode 3, the photocathode holder 6, and the photocathode drive device 7. That is, in the electron guns 1A to 1D according to the above embodiments, while existing components can be used for the light source 2, the vacuum chamber CB, the photocathode 3, the photocathode holder 6, and the photocathode drive device 7, the electrode kit 4 and the electrode kit drive device 5 can be provided as a component.

Embodiment of Electron Beam Applicator

The counterpart device E to which each of the electron guns 1A to 1D in the above embodiments is mounted may be a known device to which each of the electron guns 1A to 1D is mounted. For example, the counterpart device E may be a free electron laser accelerator, an electron microscope, an electron holography device, an electron beam drawing device, an electron diffractometer, an electron beam inspection device, an electron beam metal additive manufacturing device, an electron beam lithography device, an electron beam processing device, an electron beam curing device, an electron beam sterilization device, an electron beam disinfection device, a plasma generation device, an atomic element generation device, a spin-polarized electron beam generation device, a cathodoluminescence device, an inverse photoemission spectroscopy device, or the like.

Note that the present invention is not limited to the embodiments described above. Any combination of respective embodiments described above or modification or omission of any component in these embodiments can be made within the scope of the present invention. Furthermore, any component may be added to respective embodiments described above.

INDUSTRIAL APPLICABILITY

The use of the electron gun, the electron gun component, and the alignment method disclosed in the present application enables adjustment of the emission axis of an electron beam even when the electron gun is mounted to a position out of an adjusted position of the optical axis of the electron optical system of the counterpart device. Therefore, the electron gun, the electron gun component, and the alignment method disclosed in the present application are useful for business entities that handle an electron gun.

LIST OF REFERENCES 1, 1A to 1D electron gun
2 light source
3 photocathode
4 electrode kit
41 photocathode supporting part
42 anode
43 fixing member
44 intermediate electrode
45 electron beam passage hole
46 entrance
47 exit
48 drift space
5 electrode kit drive device
5X X-direction drive device
5Y Y-direction drive device
51X first stage
51Y second stage
52X first drive source 52Y second drive source
53X first motive power transmission mechanism
53Y second motive power transmission mechanism
54 guide
55 hole-less wall
56 expansion and contraction member
57X first resilient member
57Y second resilient member
6, 6A photocathode holder
61 lens
62 spacer
7 photocathode drive device
71 fifth drive source
72 fifth motive power transmission mechanism
73 pressing member
B electron beam
CB vacuum chamber
E counterpart device
L excitation light
m optical axis of electron optical system of the counterpart device E
n center axis of the photocathode supporting part 41
center axis of the photocathode 3

The invention claimed is:

1. An electron gun comprising:
a light source;
a vacuum chamber;
a photocathode that emits an electron beam in response to receiving light from the light source;
an electrode kit; and
an electrode kit drive device,
wherein the electrode kit includes
a photocathode supporting part, and
an anode arranged spaced apart from the photocathode supporting part,
wherein the photocathode is placed on the photocathode supporting part, and
wherein the electrode kit drive device moves the electrode kit in an X-Y plane, where one direction is defined as an X direction, a direction orthogonal to the X direction is defined as a Y direction, and a plane including the X direction and the Y direction is defined as the X-Y plane.

2. The electron gun according to claim 1, wherein the photocathode, the electrode kit, and a part of the electrode kit drive device are arranged inside the vacuum chamber.

3. The electron gun according to claim 1, wherein the electrode kit drive device includes a stage, and the anode is placed on the stage.

4. The electron gun according to claim 3, wherein the stage includes
a first stage configured to move in the X direction, and
a second stage configured to move in the Y direction.

5. The electron gun according to claim 1, wherein the electrode kit includes an intermediate electrode arranged between the photocathode supporting part and the anode.

6. The electron gun according to claim 1 further comprising a photocathode drive device that moves the photocathode in a Z direction orthogonal to the X direction and the Y direction,
wherein the photocathode drive device includes a pressing member that presses the photocathode against the photocathode supporting part when the photocathode is placed on the photocathode supporting part, and
wherein the photocathode pressed by the pressing member moves to follow the photocathode supporting part in accordance with motion of the electrode kit.

7. The electron gun according to claim 1 further comprising a photocathode holder,
wherein the photocathode holder holds the photocathode and includes a lens that is arranged spaced apart from the photocathode and collects light from the light source on the photocathode.

8. An electron gun component comprising:
an electrode kit; and
an electrode kit drive device,
wherein the electrode kit includes
a photocathode supporting part, and
an anode arranged spaced apart from the photocathode supporting part,
wherein the electrode kit drive device moves the electrode kit in an X-Y plane, where one direction is defined as an X direction, a direction orthogonal to the X direction is defined as a Y direction, and a plane including the X direction and the Y direction is defined as the X-Y plane.

9. The electron gun component according to claim 8,
wherein the electrode kit drive device includes a stage, and
wherein the anode is placed on the stage.

10. The electron gun component according to claim 9, wherein the stage includes
a first stage configured to move in the X direction, and
a second stage configured to move in the Y direction.

11. The electron gun component according to claim 8, wherein the electrode kit includes an intermediate electrode arranged between the photocathode supporting part and the anode.

12. An electron beam applicator including the electron gun according to claim 1, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

13. An alignment method for aligning an emission axis of an electron beam emitted from an electron gun with an optical axis of an electron optical system of an electron beam applicator,
wherein the electron gun includes
a light source,
a photocathode,
an electrode kit, and
an electrode kit drive device,
wherein the electrode kit includes
a photocathode supporting part, and
an anode arranged spaced apart from the photocathode supporting part,
wherein the electrode kit drive device moves the electrode kit in an X-Y plane, where one direction is defined as an X direction, a direction orthogonal to the X direction is defined as a Y direction, and a plane including the X direction and the Y direction is defined as the X-Y plane, the alignment method comprising:

an electron beam emission step of irradiating the photocathode with light from the light source to cause the photocathode to emit an electron beam; and an electron beam emission axis adjustment step of, while emitting the electron beam, using the electrode kit drive device to move the electrode kit on which the photocathode is placed and aligning the emission axis of the electron beam with the optical axis of the electron optical system of the electron beam applicator.

14. The alignment method according to claim 13 further comprising:

a photocathode alignment step of moving the electrode kit so that an irradiation position of the photocathode irradiated from the light source overlaps the center of the photocathode supporting part when viewed from a Z direction orthogonal to the X direction and the Y direction and aligning the photocathode and the electrode kit with each other; and a photocathode placement step of placing the photocathode on the photocathode supporting part.

15. The electron gun according to claim 2, wherein the electrode kit drive device includes a stage, and the anode is placed on the stage.

16. The electron gun according to claim 15, wherein the stage includes a first stage configured to move in the X direction, and a second stage configured to move in the Y direction.

17. The electron gun according to claim 2, wherein the electrode kit includes an intermediate electrode arranged between the photocathode supporting part and the anode.

18. The electron gun according to claim 3, wherein the electrode kit includes an intermediate electrode arranged between the photocathode supporting part and the anode.

19. The electron gun according to claim 4, wherein the electrode kit includes an intermediate electrode arranged between the photocathode supporting part and the anode.

20. The electron gun according to claim 2 further comprising a photocathode drive device that moves the photocathode in a Z direction orthogonal to the X direction and the Y direction, wherein the photocathode drive device includes a pressing member that presses the photocathode against the photocathode supporting part when the photocathode is placed on the photocathode supporting part, and wherein the photocathode pressed by the pressing member moves to follow the photocathode supporting part in accordance with motion of the electrode kit.

* * * * *